United States Patent
Pai et al.

(10) Patent No.: US 8,526,636 B1
(45) Date of Patent: Sep. 3, 2013

(54) CLICK-POP NOISE SUPPRESSION SYSTEM

(75) Inventors: Venkatesh P. Pai, Gilbert, AZ (US); Mohammad Rehman, Chandler, AZ (US); Umesh Jayamohan, Gilbert, AZ (US)

(73) Assignee: Protek Devices LP, Tempe, AZ (US)

( * ) Notice: Subject to any disclaimer, the term of this patent is extended or adjusted under 35 U.S.C. 154(b) by 547 days.

(21) Appl. No.: 12/832,010

(22) Filed: Jul. 7, 2010

Related U.S. Application Data

(60) Provisional application No. 61/223,625, filed on Jul. 7, 2009, provisional application No. 61/226,023, filed on Jul. 16, 2009.

(51) Int. Cl.
*H04B 15/00* (2006.01)
(52) U.S. Cl.
USPC ......................................... 381/94.5; 381/94.1

(58) Field of Classification Search
USPC ................................................ 381/94.5, 94.1
See application file for complete search history.

(56) References Cited

U.S. PATENT DOCUMENTS

| | | | |
|---|---|---|---|
| 7,760,016 B2* | 7/2010 | Kanji et al. | 330/51 |
| 7,804,967 B2* | 9/2010 | Kang | 381/94.5 |
| 8,155,347 B2* | 4/2012 | Li et al. | 381/94.5 |
| 2009/0196435 A1* | 8/2009 | Miao | 381/94.5 |
| 2009/0208032 A1* | 8/2009 | Wu | 381/94.5 |

* cited by examiner

*Primary Examiner* — Mohammad Islam
*Assistant Examiner* — David Ton
(74) *Attorney, Agent, or Firm* — Cahill Glazer PLC

(57) ABSTRACT

A click-noise suppression system having MOSFET transistor switches positioned between the preamplifiers and coupling capacitors of an audio system wherein the suppression system maintains the switches off when the system is turned on until a charging circuit increases the gate voltage of the switches. The switches quickly turn off and the coupling capacitors are discharged through discharge resistors when the system is turned off.

10 Claims, 5 Drawing Sheets

CLICK-POP NOISE SUPPRESSION SYSTEM

CROSS-REFERENCE TO RELATED APPLICATION

This application is related to and claims priority to a provisional application entitled "CLICK-POP SUPPRESSION DEVICE" filed Jul. 7, 2009 and assigned Ser. No. 61/223,625 and provisional application entitled "CLICK-POP SUPPRESSION DEVICE" filed Jul. 16, 2009 and assigned Ser. No. 61/226,023. The disclosures of these applications are incorporated herein by reference.

FIELD OF THE INVENTION

The present invention relates to noise suppression circuits and particularly to devices for use with audio systems to suppress unwanted pop or clicking noises typical in audio systems when turned on or off.

BACKGROUND OF THE INVENTION

Many systems, such as home entertainment systems including set top boxes and the like, are designed with low power codecs. Usual codec voltages range from 1.8V to 3.3V, in these circumstances the maximum audio swing available at the typical DAC output is about 1 $V_{RMS}$. In order to increase the signal-to-noise ratio (SNR), system designers often drive this DAC output through an operational amplifier with a programmed gain. The amplifier will provide an output voltage swing of greater than $3V_{RMS}$ which is considered good enough for a signal-to-noise ratio of more than 48 dB. In order to amplify this signal to $3V_{RMS}$, the operational amplifier has to run at a single ended supply greater than 9V.

The systems therefore typically include a DC-blocking or coupling capacitor at the output stage of the operational amplifier; this blocking capacitor causes an audible noise to form during startup and shutdown of the system. This noise is known as pop-noise.

OBJECTS OF THE INVENTION

An object of the present invention is to provide an improved noise suppression system for the elimination of click pop-noise in an audio system.

It is also an object of the present invention to eliminate the click pop-noise when the audio system is turned on or off and to eliminate the noise creating rapid discharge of coupling capacitors.

It is still another object of the present invention to provide a noise suppression system that may be inserted in an audio system between the final stage of the audio system and the coupling capacitors and wherein the suppressor system operates using the same $V_{CC}$ as the other components in the audio output system.

It is still another object of the present invention to provide an improved noise suppression system for use with an audio system wherein the suppression of the turn on click is accomplished by maintaining MOSFET switches off and providing a controlled voltage increase through the utilization of pulse charges applied to an external capacitor.

It is another object of the present invention to provide an improved noise suppression system for connection to an audio system wherein the noise produced by turning the system off is suppressed by detecting the decrease in $V_{CC}$ upon turning the system off and promptly turning MOSFET switches off and forcing the accumulated charges on the coupling capacitors to be discharged through dedicated discharge resistors.

These and other objects of the present invention will become apparent to those skilled in the art as the description thereof proceeds.

SUMMARY OF THE INVENTION

The present invention is a monolithic device that effectively suppresses the pop-noise generated by the starting or shutting down of the audio system.

The device can operate at a $V_{CC}$ that corresponds to that utilized by the audio system. The device is inserted between the coupling capacitor and the final output stage of the system, usually a preamplifier or codec of the system. The device is connected to receive the same $V_{CC}$ as the system and acts as an intelligent buffer between the output of the final stages of the system and the coupling capacitors. When the system is turned on, the device prevents the typical initial surge in the voltage to the coupling capacitor and instead substitutes a predetermined gradual increase in voltage such that no sudden charge is presented to the coupling capacitor that would result in a click or pop noise. Similarly, the device detects the falling voltage of the $V_{CC}$ such that upon detection of a threshold value of the $V_{CC}$ the coupling capacitor is connected through the device to a discharging circuit to relatively gradually discharge the coupling capacitor to prevent a corresponding pop or noise resulting from the shutting down of the system.

DETAILED DESCRIPTION OF THE INVENTION

The present invention provides a monolithic solution to the problem of click-pop suppression for devices that are typically used for audio systems such as set top boxes and the like. The monolithic device of the present invention is placed between the codec and the output coupling capacitor or the final preamplifier and the coupling capacitor. The click-pop noise is generated at the coupling capacitors while the system is starting up as well as when it is shutting down. The present invention controls the ramping of the DC voltage into the coupling capacitors thus reducing the click-pop noise generated during the startup and the rate of discharge of the capacitors during shutdown. The present invention permits the rate of change of the voltage applied to the coupling capacitors to be controlled or changed by using a selected external capacitor.

Figure 1:
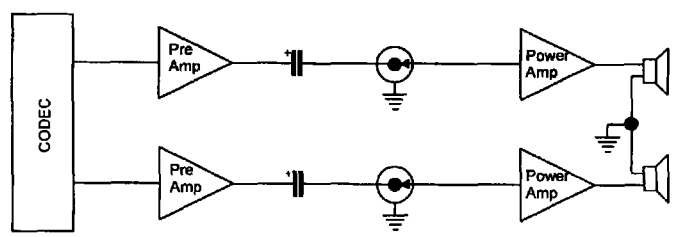
FIG. 1 is a schematic block diagram of a prior art arrangement of a preamplifier system incorporating coupling capacitors.

Referring to FIG. 1, a typical prior art set up of a preamplifier system used in audio system is shown. An appropriate codec or codecs are connected to selected preamplifiers which are then connected through coupling capacitors to audio utilization systems such as power amplifiers and ultimately to speakers. When the power supply to the system is turned on, a spike occurs in the output voltage of the system because of the charging of the various components in the system. This spike is typically referred to as a click or pop; when this click/pop noise passes through the power amplifiers, the noise is amplified and listeners hear an audible pop which frequently causes discomfort. The reverse operation happens when the system is powering down. The voltage waveforms occurring in the prior art system are exemplified in FIG. 2 wherein it may be seen from the top waveform that the supply voltage increases from 0 to the designated $V_{CC}$ level. This increase in voltage typically occurs over a time period of approximately 50 ms (this time may vary depending on the system—it could be 20 ms to 200 ms or more). Similarly, when the system is turned off the $V_{CC}$ decreases from the designated level to 0 during approximately the same time period. The second waveform in FIG. 2 exemplifies a corresponding capacitor input plate. It may be seen that the slope of the voltage increase on the plate generally corresponds with the slope of the increase in voltage of the $V_{CC}$ voltage of the supply. That is, the voltage may increase from 0 to approximately $V_{CC}/2$ in approximately 50 ms. Similarly, upon system shutoff, the bypass capacitor input voltage drops from $V_{CC}/2$ in the same approximately 50 ms. The resulting charging and discharging of the coupling capacitors over this short period of time between turn on and turn off of the system, results in a spike at the system output applied to the power amplifiers. Referring to the third waveform in FIG. 2, it may be seen that a voltage spike occurs rapidly upon turning the system on followed by a typical voltage decay. Similarly, turning off the system results in an opposite voltage spike followed by the typical decay. This startup and shutdown pop, applied through the power amplifiers, presents an annoying and sometimes discomforting pop or click to the listener.

Figure 3:
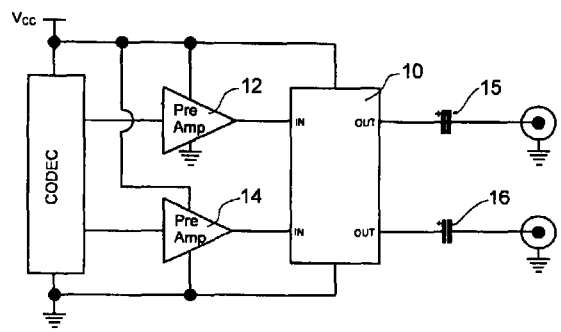
FIG. 3 is a schematic block diagram of a preamplifier system, similar to that of the prior art but incorporating the present invention.

Referring to FIG. 3, the implementation of the device of the present invention is shown. It may be noted that the monolithic device 10 of the present invention is connected between the preamplifiers 12, 14 and corresponding coupling capacitors 15 and 16 of the system previously described in reference to FIG. 1. It may be noted that the $V_{CC}$ voltage applied to the codec, and applied to the corresponding preamplifiers, is also applied to the device of the present invention. The device is thus inserted in the circuit between the preamplifiers and the coupling capacitors. At startup when the system is first turned on, the power supply ramps from 0 V to $V_{CC}$ in a typical time period that may be between 20 to 200 ms. The device of the present invention detects the ramp in the voltage at its input and controls the ramp rate of the DC bias voltage going to the bypass capacitors. The ramping behavior of the device can be controlled by an external capacitor. The resulting wave forms that have been modified by the incorporation of the device of the present invention are illustrated in FIG. 4.

Figure 2:
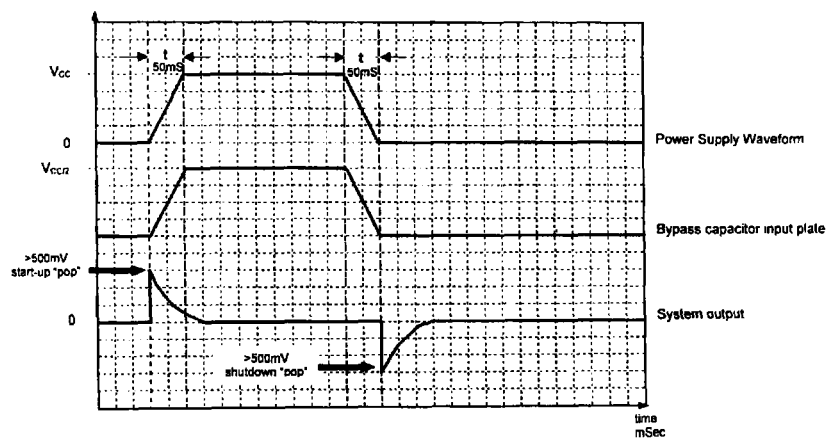
FIG. 2 is a representation of waveforms resulting from the switching on and switching off of the prior art system of FIG. 1 illustrating the existence of a click-pop noise.
Figure 4:
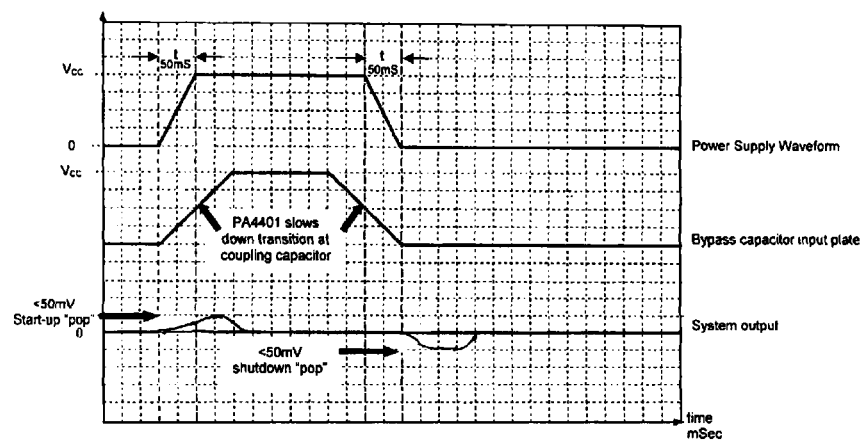
FIG. 4 is an illustration of waveforms resulting from the turning on and turning off of the system of FIG. 3 incorporating the device of the present invention.

Referring to the first waveform of FIG. 4, it may be seen that the power supply to the system ramps from 0 to $V_{CC}$ in a typical time of 50 ms. Similarly, when the system is turned off, $V_{CC}$ drops from its designated level to 0 within a similarly 50 ms. The second waveform of FIG. 4 illustrates the modified voltage level resulting through the use of the device of the present invention. The voltage at the bypass capacitor input plate, at system initiation, increases from 0 to $V_{CC}/2$; however, the time of the transition from 0 to $V_{CC}$ has been extended over a significant longer period of time. That is, the slope of the voltage increase during the time of charging of the capacitor has been lessened. Similarly, when the system is turned off, the decay of $V_{CC}/2$ from designated level to 0 also follows a slower transition with a decrease in the slope of the voltage curve as it extends from designated $V_{CC}/2$ to 0. The resulting system output is shown in the third waveform where it may be seen that upon initiation of the system, and turn-on of the $V_{CC}$, the system output is no longer a sharp surge or spike as shown in FIG. 2 but rather is a gentle sloping curve. When the power is turned off, the device of the present invention provides a discharge path for the coupling capacitor through an internal resistor. The time constant of the internal resistor and bypass capacitor allows for a slow discharge as shown by the system output waveform of FIG. 4. Thus, the spikes at the output of the system are eliminated and replaced with gentle curving voltage waveforms that greatly reduce the noise generated at turn on and turn off to the point of inaudibility.

Figure 5:
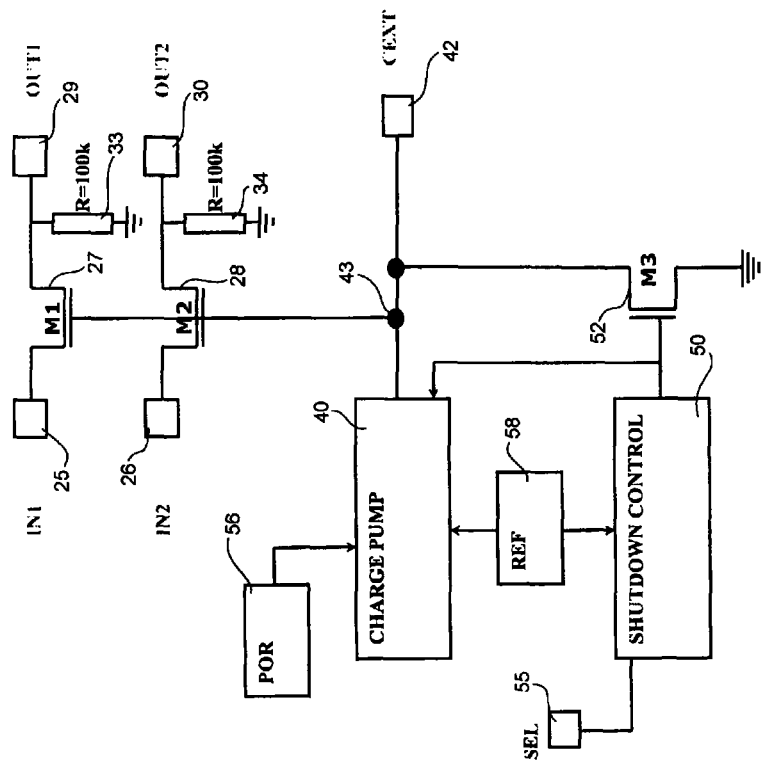
FIG. 5 is a functional block diagram illustrating components and subsystems within the device of the present invention as shown in FIG. 3.

Referring to FIG. 5, the functional block diagram of the device of the present invention is shown. Input terminals 25 and 26 are connected through respective MOSFET transistors 27 and 28, acting as normally open switches in their off state, to corresponding output terminals 28 and 30. It may be noted that the input terminals are connected to the preamplifiers such as shown in FIG. 3. The output terminals are connected to respective coupling or blocking capacitors. Thus, during normal operation, the device of the present invention is "invisible" to the system since audio signals are transmitted without modification from the corresponding preamplifier through the transistors 27 and 28 to the respective coupling capacitor. The device is also connected to $V_{CC}$. Thus, the device receives the same $V_{CC}$ and is on when the system is on and off when the system is off. The device is "invisible" during normal operation of the system and exhibits a control over the charging or discharging of coupling capacitors only during startup and turnoff of the system. Thus, when the system is turned on, the device senses the increasing $V_{CC}$ at a selected trigger point in the applied rising $V_{CC}$. When the charge pump 40 is activated it begins charging the external capacitor 42. The voltage at the charge pump/capacitor junction 43 is applied to the gates of MOSFET transistors 27 and 28. The transistors are thus gradually turned on determined by the chosen value of the external resistor. This increasing voltage and resulting gradual turn-on of the transistors connects the preamplifiers to the coupling capacitors in a predetermined gradual manner. The voltage applied to the coupling capacitors is therefore increased over a period of time determined by the chosen value of the external capacitor. In this manner, abrupt charging and resulting click or pop caused by the rapid switching of the coupling capacitors is eliminated.

When the system is turned off, the shutdown control 50 detects the falling $V_{CC}$ voltage and at 90% of the design voltage level (for example, 10.8V in a 12V system) the detection of this change in $V_{CC}$ triggers a MOSFET transistor 52 that immediately discharges the external capacitor 42 and anchors the gates of transistors 27 and 28 to ground. As a result, the transistors are clamped to ground thus disconnecting the input terminals 25 and 26 from the corresponding output terminals 29 and 30. The coupling capacitors may thus discharge only through discharge resistors 33 and 34. The slope of the decreasing voltage on the coupling capacitors is thus controlled by the value of the discharge resistors which provide a gradual voltage decay rather than an abrupt voltage drop resulting in a spike in the waveform and a pop or click in the audio system.

The select function 35 permits the selection of the appropriate operating $V_{CC}$ voltage as determined by the remainder of the system. Thus, the system may be utilized with a predetermined $V_{CC}$ value such as typical 12V or 9V systems. The power-on or reset function 56 provides a triggering pulse to the charge pump 40 to initiate the charging function provided by the pump. The reference voltage function 58 provides the appropriate reference voltage to the comparator of the feedback loop in the charge pump 40 and also provides voltage to the comparator in the shutdown control 50.

Figure 6:
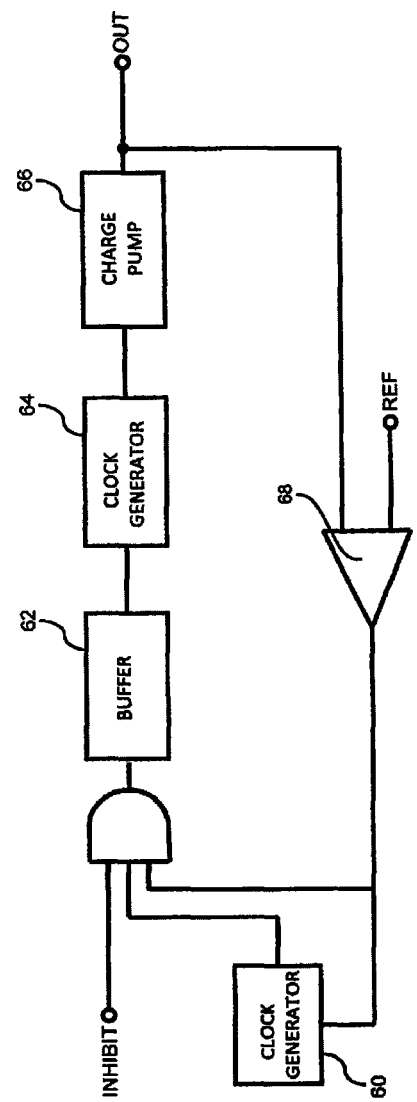
FIG. 6 is a schematic block diagram of the functional elements of the charge pump shown in FIG. 5.

Referring to FIG. 6, a functional block diagram of a suitable charge pump is illustrated. The charge pump may take any of a variety of forms, the design of which are well known to those skilled in the art. A clock generator 60 produces square pulses (for example at a frequency of 1.3 to 3 MHz). This clock generator 60 or pulse generator applies the pulses to a buffer 62, connected to a non-overlapping clock generator 64, and to a two-stage Dickson charge pump 66. A reference voltage from the reference function 58 of FIG. 5 is applied to a comparator 68 in a feedback loop. When the voltage has attained a predetermined value, for example 25V, the comparator in the feedback loop signals the clock generator and logic gate to cease further pulse generation to thus maintain the output voltage at the selected value. The charge pump output, as described above, provides a charging voltage to the external capacitor with the resulting capacitor voltage and charge pump output acting as the controlling voltage input to the transistors 27 and 28 to provide the predetermined switching rate-of-change for the application of startup voltage to the coupling capacitors.

Figure 7:
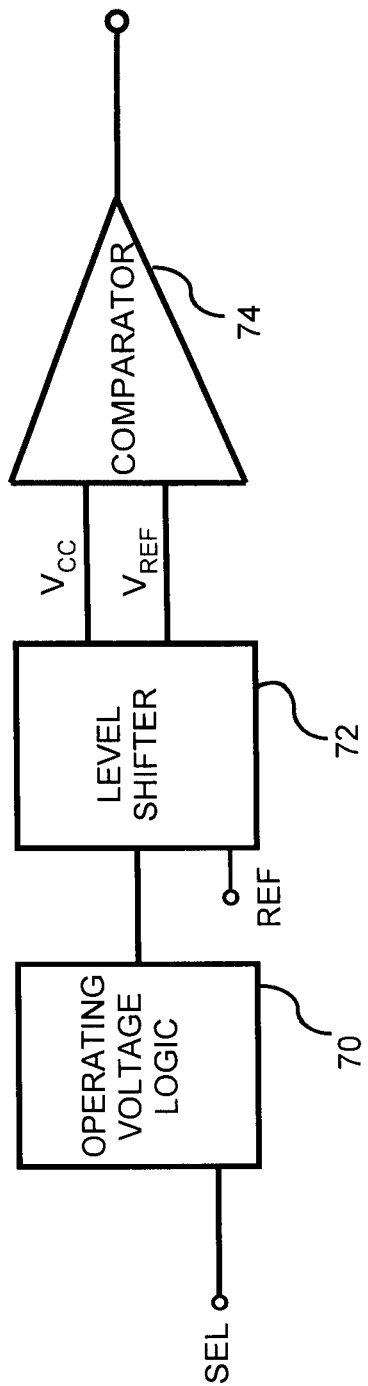
FIG. 7 is a schematic block diagram of the shutdown control of FIG. 5.

Referring to FIG. 7, the functional block diagram of the shut down control 50 of FIG. 5 is shown. An operating voltage logic network 70, well known in the art, is provided with a select signal 55 as discussed previously; the select signal is chosen at the device installation for a predetermined $V_{CC}$. The operating voltage logic output is applied to a level shifter 72, the output of the level shifter is applied to a comparator 74 wherein the existing $V_{CC}$ is compared to a reference value supplied to level shifter from the reference functions 58 of FIG. 5. The comparator detects a decrease in $V_{CC}$, and at 90% of the design $V_{CC}$ (10.8V in a 12V system for example) the comparator applies a triggering voltage to the gate of MOSFET 52. The result of this detection of the falling $V_{CC}$ and the application of the triggering voltage to transistor M3 is the immediate grounding of the gates of transistors 27 and 28 thus turning them off. The switching of transistors 27 and 28 to their off state promptly disconnects the output of the preamplifiers from the coupling capacitors with the result that the coupling capacitors now may only discharge through the discharge resistors 33 and 34 as described in connection with FIG. 5.

The functional block diagrams of the charge pump and shutdown control shown in FIGS. 6 and 7 describe functional components familiar to those skilled in the art. It is therefore not believed that greater detail or specific circuitry is necessary in view of the fact that such components are readily recognized by those skilled in the art. However, additional details including component values may be found in the above identified provisional applications that have been incorporated herein by reference.

Thus, the present invention provides a noise suppression system and device that is inserted in a conventional audio output arrangement and acts as a blocking circuit between the final stage or preamplifier output stage and the blocking or coupling capacitor. When the system or device is inserted, it operates on the same $V_{CC}$ as the preamplifiers or codec, and when the entire system is on, all of the audio system components including amplifiers, etc., are supplied with the common $V_{CC}$. When the audio system is off, and it is turned on, the $V_{CC}$ increases until it reaches a threshold level turning the device on which then effectively blocks any signal from the audio amplifier or preamplifier to the coupling capacitor and instead generates its own increasing output to the coupling capacitor that exhibits a lesser slope and therefore prevents the conventional pop-noise that is heard by a listener when the system is first turned on. The slope of the start-up or turn-on voltage supplied by the device to the coupling capacitor may be controlled by selecting an external capacitor connected to the device and choosing the capacitance of the capacitor to provide the desired slope. When the system is operating the device is essentially invisible and the audio signals from the codec or preamplifier are passed through the device to the coupling capacitor and to the audio system. When the system is turned off, the $V_{CC}$ which is applied to the entire audio system including the device, begins to deteriorate and as soon as the $V_{CC}$ decreases to a predetermined value (chosen to be 90% of the nominal value in the embodiment chosen for illustration), the shutdown circuit within the device is activated; the connection between the preamplifier and the coupling capacitor through the device is immediately disconnected which forces the coupling capacitor to discharge slowly through a designated discharge resistor within the device. Thus, when the entire system is shut off, no pop-noise is audible to the listener since the coupling capacitor is discharged slowly through the device.

The present invention has been described in terms of selected specific embodiments of the apparatus and method incorporating details to facilitate the understanding of the principles of construction and operation of the invention. Such reference herein to a specific embodiment and details thereof is not intended to limit the scope of the claims appended hereto. It will be apparent to those skilled in the art that modifications may be made in the embodiments chosen for illustration without departing from the spirit and scope of the invention.

What is claimed:

1. In an audio system having an output stage operating with a predetermined $V_{CC}$ and a coupling capacitor for connection to an audio utilization system, a noise suppression device comprising:
   (a) a normally off switch connected between said output stage and said coupling capacitor;
   (b) said switch on during operation of the system to connect the output stage to the coupling capacitor;
   (c) comparator means responsive to a decreased voltage level of $V_{CC}$ as the system is shut down for generating a triggering signal;
   (d) means connecting said triggering signal to said switch to turn said switch off; and
   (e) a discharge resistor connected to a junction between said switch and coupling capacitor and connected to ground to provide a discharge path for a charge accumulated at said capacitor when the system is shut down.

2. The noise suppression device of claim 1 wherein said switch is a MOSFET transistor wherein the gate is connected to ground in response to said triggering signal.

3. In an audio system having an output stage operating with a predetermined $V_{CC}$ and a coupling capacitor for connection to an audio utilization system, a noise suppression device comprising:

(a) a normally off switch connected between said output stage and said coupling capacitor;

(b) charging means responsive to a predetermined level of the $V_{CC}$ as the system is turned on;

(c) an external capacitor connected to receive charging voltage from said charging means;

(d) means connecting said switch to the external capacitor to apply capacitor voltage to said switch to turn said switch on;

(e) said switch on during operation of the system to connect the output stage to the coupling capacitor;

(f) comparator means responsive to a decreased voltage level of $V_{CC}$ as the system is shut down for generating a triggering signal;

(g) means connecting said triggering signal to said switch to turn said switch off; and (h) a discharge resistor connected to a junction between said switch and coupling capacitor and connected to ground to provide a discharge path for a charge accumulated at said capacitor when the system is shut down.

4. The noise suppression device of claim 3 wherein said switch is a MOSFET transistor switch and wherein the gate of said MOSFET transistor is connected to the external capacitor to apply capacitor voltage to the gate to turn the transistor switch on.

5. The noise suppression device of claim 3 wherein said switch is a MOSFET transistor switch and wherein the gate of the MOSFET transistor is connected to the external capacitor to apply capacitor voltage to the gate to turn the switch on during turn-on of the system, and wherein the gate of the MOSFET transistor is connected to ground in response to said triggering signal when the system is being turned off.

6. In a device for suppressing the pop-click noise in an audio system, the improvement comprising:

(a) a normally off MOSFET transistor switch connected between a final stage in said system and a coupling capacitor;

(b) a charge pump responsive to a predetermined threshold voltage of $V_{CC}$ as $V_{CC}$ increases when the system is turned on for charging an external capacitor; and (c) means connecting the voltage on the external capacitor to the gate of the MOSFET to gradually turn the MOSFET on and thus gradually apply voltage to the coupling capacitor.

7. In a device for suppressing the pop-click noise in an audio system having a designed $V_{CC}$, the improvement comprising:

(a) a first MOSFET transistor switch connected between an output preamplifier in said system and a coupling capacitor;

(b) a second MOSFET transistor switch connected between the gate of the first MOSFET switch and ground;

(c) a comparator for comparing the present $V_{CC}$ with a reference voltage and detecting a reduction in $V_{CC}$ when the system is turning off, and for producing a trigger signal when $V_{CC}$ drops below a predetermined level; and (d) the second MOSFET having a gate connected to receive said trigger signal to turn on and to connect the gate of the first MOSFET to ground to thus turn the first MOSFET off.

8. In a device for suppressing the pop-click noise in an audio system having a designated $V_{CC}$, the improvement comprising:

(a) a first MOSFET transistor switch connected between an output preamplifier in said system and a coupling capacitor;

(b) a second MOSFET transistor switch connected between the gate of the first MOSFET switch and ground;

(c) a charge pump responsive to a predetermined threshold voltage of $V_{CC}$ as $V_{CC}$ increases when the system is turned on for charging an external capacitor;

(d) means connecting the voltage on the external capacitor to the gate of the first MOSFET to gradually turn the first MOSFET on and thus gradually apply voltage to the coupling capacitor;

(e) said first MOSFET switch on during operation of the system to connect the output stage to the coupling capacitor;

(f) a comparator for comparing the present $V_{CC}$ with a reference voltage and detecting a reduction in $V_{CC}$ when the system is turning off, and for producing a trigger signal when $V_{CC}$ drops below a predetermined level; and (g) said second MOSFET transistor having a gate connected to receive said trigger signal to turn the second MOSFET switch on and to connect the gate of the first MOSFET switch to ground to thus promptly turn the first MOSFET off.

9. A method for suppressing click-pop noise in an audio system having an output stage connected to a coupling capacitor comprising:

(a) inserting a normally off transistor switch between said output stage and said coupling capacitor;

(b) gradually closing the switch when the system is turned on; and (c) rapidly opening the switch when the system is turned off.

10. The method of claim 9 wherein the transistor switch is a MOSFET switch and is turned on by applying a gradually increasing voltage to the gate thereof and is turned off by grounding the gate thereof.

* * * * *